United States Patent
Kuyel et al.

(10) Patent No.: US 6,897,794 B2
(45) Date of Patent: May 24, 2005

(54) ALL-ANALOG CALIBRATION OF STING-DAC LINEARITY: APPLICATION TO HIGH VOLTAGE PROCESSES

(75) Inventors: Turker Kuyel, Austin, TX (US); Abdullah Yilmaz, Tucson, AZ (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 10/803,018

(22) Filed: Mar. 17, 2004

(65) Prior Publication Data

US 2005/0001747 A1 Jan. 6, 2005

Related U.S. Application Data

(60) Provisional application No. 60/484,693, filed on Jul. 3, 2003.

(51) Int. Cl.[7] .................................................. H03M 1/10
(52) U.S. Cl. ........................................ 341/120; 341/144
(58) Field of Search ............................... 341/144, 120, 341/145

(56) References Cited

U.S. PATENT DOCUMENTS

| | | | |
|---|---|---|---|
| 4,412,208 A | * 10/1983 | Akazawa et al. | 341/145 |
| 4,450,433 A | * 5/1984 | Moriyama | 341/145 |
| 4,885,581 A | * 12/1989 | Sugawara et al. | 341/145 |
| 5,825,317 A | * 10/1998 | Anderson et al. | 341/120 |
| 6,204,785 B1 | 3/2001 | Fattaruso et al. | 341/120 |
| 6,489,905 B1 | * 12/2002 | Lee et al. | 341/120 |
| 6,642,869 B2 | 11/2003 | Kuyel et al. | 341/120 |
| 6,674,377 B1 | * 1/2004 | Li | 341/120 |

OTHER PUBLICATIONS

Texas Instruments, "16–Bit, Low Power, Voltage Output, I²C Interface Digital–to–Analog Converter", DAC8571, Copyright 2002–2003– PP 1–28.

* cited by examiner

Primary Examiner—Peguy JeanPierre
(74) Attorney, Agent, or Firm—W. Daniel Swayze, Jr.; W. James Brady; Frederick J. Telecky, Jr.

(57) ABSTRACT

A system and method of calibrating a digital-to-analog converter (DAC) such as a resistor string DAC that reduces costs by making more efficient use of semiconductor die area. A digital-to-analog converter includes a main DAC to be calibrated, a memory, a plurality of calibration DACs, and an analog summing circuit. The main DAC receives digital input code values, and converts the respective input code values into an analog signal. A first calibration DAC receives a predetermined number of lower order bits of the respective input code values, and interpolates between a positive reference voltage and a negative reference voltage to generate linear waveforms for the PWL approximation. A second calibration DAC generates the positive reference voltage, and a third calibration DAC generates the negative reference voltage. The memory stores a plurality of PWL breakpoint code values representing respective integral non-linearity error values of the main DAC, and applies consecutive PWL breakpoint code values to the second and third calibration DACs, respectively, to generate the positive and negative reference voltages for the first calibration DAC.

27 Claims, 3 Drawing Sheets

ALL-ANALOG CALIBRATION OF STING-DAC LINEARITY: APPLICATION TO HIGH VOLTAGE PROCESSES

CROSS REFERENCE TO RELATED APPLICATIONS

This application claims priority of U.S. Provisional Patent Application No. 60/484,693 filed Jul. 3, 2003 entitled CALIBRATION OF DAC LINEARITY USING PWL APPROXIMATION.

STATEMENT REGARDING FEDERALLY SPONSORED RESEARCH OR DEVELOPMENT

N/A

BACKGROUND OF THE INVENTION

The present application relates generally to digital-to-analog converters, and more specifically to an improved piece-wise linear calibration technique for resistor string digital-to-analog converters.

Digital-to-analog converters (DACs) are known that employ resistor strings to convert digital input code values into analog signals. In a typical mode of operation, a conventional resistor string DAC receives digital input code values at an input of the DAC, and employs a resistor string to convert the respective digital input code values into an analog signal at an output of the DAC. Each digital input code value represents a quantized value, which is converted into a corresponding analog value based on the transfer function of the DAC.

The resistor string of the conventional DAC described above includes a number of resistors connected in series, in which each resistor has a voltage tap at each of its ends. Further, the resistor string is typically biased at each of its opposing ends by two different reference voltages. For example, one reference voltage may be a positive voltage ranging from about 1 to 5 volts, and the other reference voltage may be a negative voltage ranging from about −1 to −5 volts. Accordingly, the resistor string forms a voltage divider network, and each voltage tap of the resistor string is accessible to obtain a desired digital-to-analog conversion.

One drawback of the conventional resistor string DAC is that the offset, gain, and/or integral non-linearity of the DAC are typically imperfect. As a result, the analog output signal produced by the DAC frequently has an error component, which prevents the amplitude of the DAC analog output signal from directly corresponding to the magnitude of the digital input code values at the DAC input.

One way of improving the offset, gain, and integral non-linearity of the conventional resistor string DAC is to apply a laser trimming technique to the resistor string included therein to assure that each resistor in the string has substantially the same resistance value. In this way, the division of the bias voltage across the resistor string can be made more uniform, thereby improving the offset, gain, and integral non-linearity of the DAC. However, employing such laser trimming techniques can significantly increase the overall cost of the DAC.

The offset, gain, and integral non-linearity of the conventional DAC can also be improved by a digital calibration technique. For example, a conventional circuit for digitally calibrating a DAC may include a main DAC to be calibrated, a single calibration DAC, a memory, and at least one digital logic block for performing arithmetic operations. In a typical mode of operation, a plurality of integral non-linearity error values of the main DAC are determined, and the error values are coded into the memory as control points. Next, when a digital input code value is applied to the DAC input, a determination is made as to which two adjacent control points the code value lies between. A piecewise linear (PWL) function is then established between the two control points, and an error value is interpolated from the PWL function corresponding to the applied digital input code value by the arithmetic logic circuitry. The interpolated error values are representative of an interpolated approximation of the main DAC's integral non-linearity curve. Next, the interpolated error value is applied to the input of the calibration DAC to produce a corresponding analog output, which is subsequently subtracted from the output of the main DAC to remove the error component therefrom.

However, implementing the above-described digital DAC calibration technique on a semiconductor die (i.e., an integrated circuit chip) can be problematic, especially in high voltage applications (e.g., ±10 volt output range) that employ large geometry process technology (e.g., approximately 2 µm minimum feature length). This is because in such large geometry processes, the computation of the PWL arithmetic by the digital logic circuitry often results in inefficient use of the die area, thereby increasing costs.

It would therefore be desirable to have an improved calibration technique for digital-to-analog converters. Such a DAC calibration technique would be adaptable for calibrating DACs that employ resistor strings. It would also be desirable to have a DAC calibration technique that makes more efficient use of semiconductor die area.

BRIEF SUMMARY OF THE INVENTION

In accordance with the present invention, a system and method of calibrating a digital-to-analog converter (DAC) such as a resistor string DAC is provided that reduces costs by making more efficient use of semiconductor die area. Benefits of the presently disclosed DAC calibration technique are achieved by employing multiple calibration DACs, which are configured to minimize the amount of digital logic circuitry needed to generate a piecewise linear (PWL) approximation of the integral non-linearity error of a main DAC to be calibrated.

In one embodiment, a digital-to-analog converter includes a main DAC to be calibrated, a memory, a plurality of calibration DACs, and an analog summing circuit. The main DAC is configured to receive digital input code values at an input of the main DAC, and to convert the respective digital input code values into an analog signal at an output of the main DAC, wherein the analog output signal deviates from a desired analog output signal of the main DAC. A first one of the plurality of calibration DACs is configured to receive a predetermined number of lower order bits of the respective digital input code values, and to interpolate between a positive reference voltage and a negative reference voltage applied thereto, thereby generating linear waveforms for the PWL approximation. A second calibration DAC is configured to generate the positive reference voltage of the first calibration DAC, and a third calibration DAC is configure to generate the negative reference voltage of the first calibration DAC. The memory is configured to store a plurality of PWL breakpoint code values representing respective digital correction values for the analog output of the main DAC, and to apply consecutive PWL breakpoint code values directly to the second and third calibration DACs, respectively, thereby generating the positive and negative reference voltages for the first calibration DAC. In effect, the second and third calibration DACs are operative to set consecutive PWL breakpoints corresponding to the digital input code value by setting the positive and negative reference voltages of the first calibration DAC.

To maintain the continuity of the generated linear waveforms, the first calibration DAC is configured to produce analog outputs that either ramp up or ramp down between the positive and negative reference voltages applied thereto. In the event a linearly increasing/decreasing digital code word sequence is applied to the first calibration DAC, the first calibration DAC either interpolates from the negative reference voltage to the positive reference voltage, or interpolates from the positive reference voltage to the negative reference voltage, based at least in part on the relative values of the consecutive PWL breakpoints provided by the second and third calibration DACs. The main DAC and the first calibration DAC then provide their respective analog outputs to the analog summing circuit, which is operative to obtain the difference between the respective analog signals to produce a calibrated analog output.

By employing multiple calibration DACs to minimize the amount of digital logic circuitry needed to generate a piecewise linear approximation of the integral non-linearity error of a main DAC to be calibrated, a DAC calibration circuit can be obtained that makes more efficient use of semiconductor die area and therefore reduces costs. The presently disclosed DAC calibration technique also obviates the need for costly thin film resistor trimming.

Other features, functions, and aspects of the invention will be evident from the Detailed Description of the Invention that follows.

BRIEF DESCRIPTION OF THE SEVERAL VIEWS OF THE DRAWINGS

The invention will be more fully understood with reference to the following Detailed Description of the Invention in conjunction with the drawings of which.

DETAILED DESCRIPTION OF THE INVENTION

U.S. Provisional Patent Application No. 60/484,693 filed Jul. 3, 2003 entitled CALIBRATION OF DAC LINEARITY USING PWL APPROXIMATION is incorporated herein by reference.

A system and method of calibrating a digital-to-analog converter (DAC) is disclosed that makes more efficient use of semiconductor die area, thereby reducing costs. The presently disclosed DAC calibration technique employs multiple calibration DACs, which are configured to minimize the amount of digital logic circuitry needed to generate a piecewise linear (PWL) approximation of the integral non-linearity error of the DAC to be calibrated.

Figure 1:
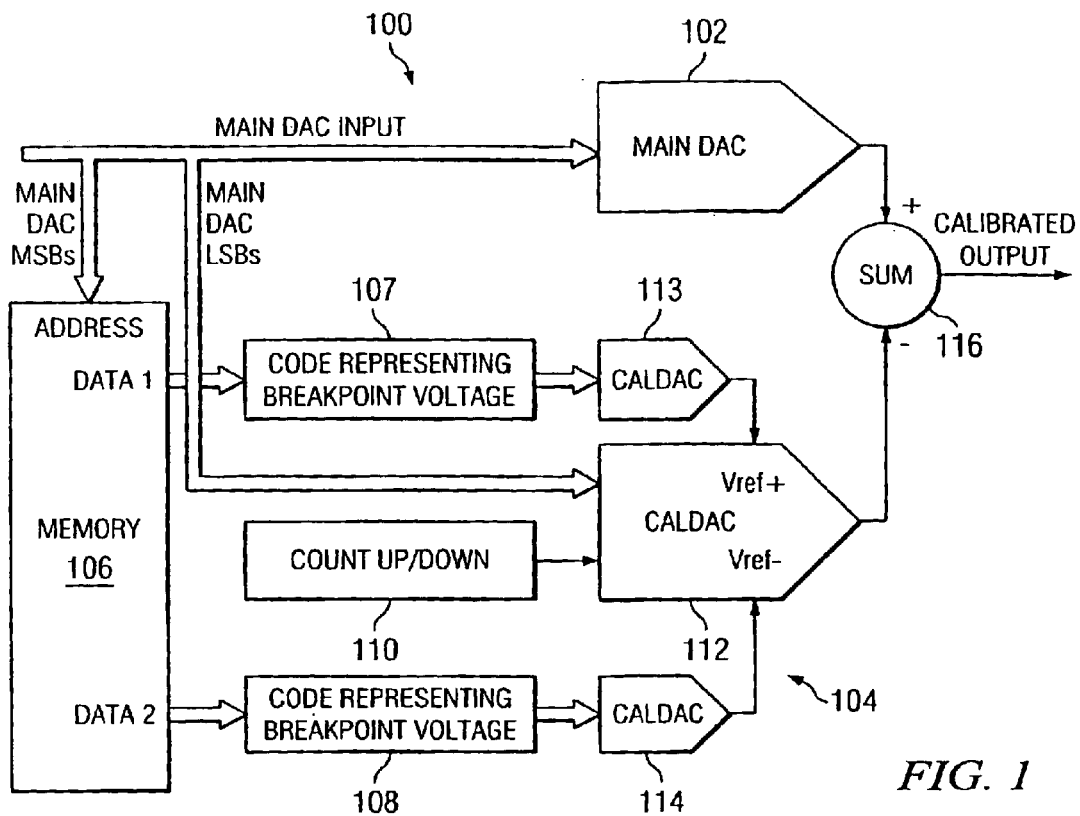
FIG. 1 is a block diagram of a digital-to-analog converter including a DAC calibration circuit according to the present invention.

FIG. 1 depicts an illustrative embodiment of a digital-to-analog converter 100, in accordance with the present invention. In the illustrated embodiment, the DAC 100 comprises a main DAC 102 to be calibrated, and a DAC calibration circuit 104, which includes a memory 106, a pair of DAC registers 107–108, a count up/down DAC control circuit 110, a plurality of calibration DACs 112–114, and an analog summing circuit 116.

Specifically, the main DAC 102 is configured to receive respective digital input code values (Main DAC Input) at an input of the main DAC 102, and to convert the digital input code values into an analog signal at an output of the main DAC 102. For example, the main DAC 102 may have a resistor string architecture, or any other suitable DAC architecture having good differential non-linearity characteristics and therefore good monotonicity. It is noted, however, that a DAC architecture such as the resistor string architecture typically has less than optimal integral non-linearity characteristics. As a result, the analog output signal produced by the main DAC 102 may have an error component, which may prevent the amplitude of the DAC analog output signal from directly corresponding to the magnitude of the digital input code values at the DAC input.

To remove the integral non-linearity error from the output of the main DAC 102, the DAC calibration circuit 104 is configured to generate an analog output signal proportional to the integral non-linearity error component of the main DAC 102 output, and to subtract the generated analog output from the main DAC 102 output, thereby producing a Calibrated Output with improved integral non-linearity characteristics. In the presently disclosed embodiment, the analog output generated by the DAC calibration circuit 104 is a piecewise linear (PWL) approximation of the integral non-linearity error of the main DAC 102.

Specifically, the PWL approximation of the integral non-linearity error of the main DAC 102 is generated by the calibration DAC 112, which effectively interpolates between a positive reference voltage Vref+ and a negative reference voltage Vref− to generate the PWL approximation. In the illustrated embodiment, the calibration DACs 113–114 provide the Vref+ and Vref− reference voltages, respectively, to the calibration DAC 112. The Vref+ and Vref− reference voltages correspond to consecutive pairs of PWL breakpoint code values, a predetermined number of which are stored in the memory 106. In the preferred embodiment, the memory 106 is an on-chip programmable nonvolatile memory circuit. For example, the memory 106 may comprise a fuse link memory, an EEPROM, a FLASH memory, or any other suitable type of memory. The memory 106 provides the consecutive pairs of PWL breakpoint code values to the DAC registers 107–108, which subsequently provide the PWL breakpoint code values directly to the calibration DACs 113–114 to generate the respective Vref+ and Vref− reference voltages. As shown in FIG. 1, a predetermined number of most significant bits (MSBs) of the respective digital input code values of the main DAC 102 (Main DAC MSBs) are provided to the address inputs of the memory 106, and a predetermined number of least significant bits (LSBs) of the respective digital input code values (Main DAC LSBs) are provided to the input of the calibration DAC 112. It is understood that alternative numbers of higher order bits and lower order bits of the Main DAC Input may be provided to the memory 106 and the calibration DAC 112, respectively, to produce a desired PWL approximation.

Figure 2:
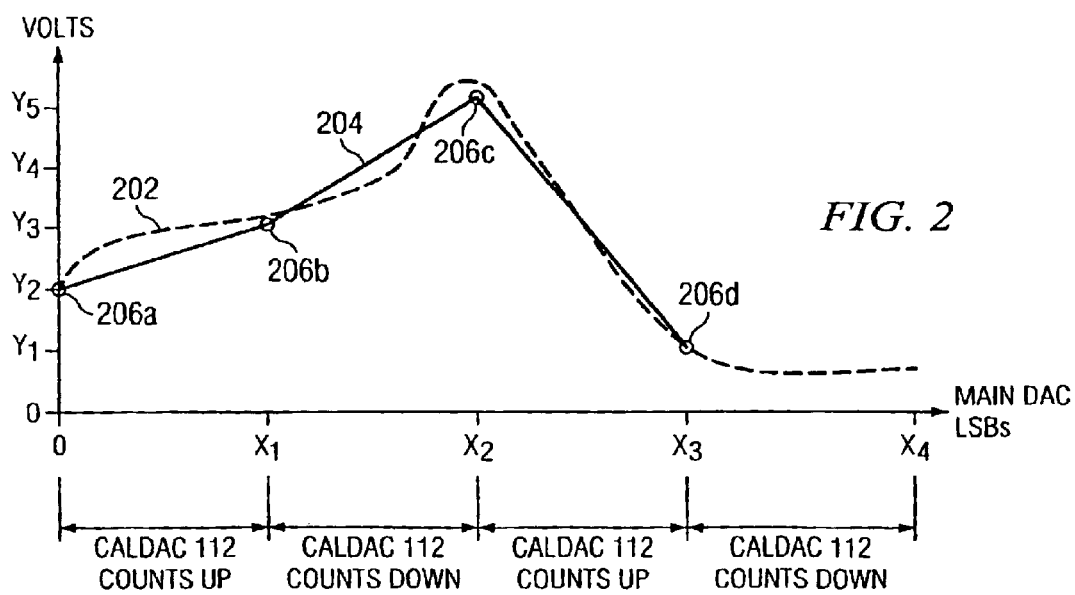
FIG. 2 is a diagram illustrating an integral non-linearity error of the digital-to-analog converter of FIG. 1, and a corresponding piecewise linear approximation of the DAC integral non-linearity error.

FIG. 2 depicts illustrative representations of an integral non-linearity error curve 202 of the main DAC 102, and a PWL approximation 204 of the main DAC integral non-linearity error curve, versus the main DAC LSBs. As described above, the main DAC LSBs are applied to the input of the calibration DAC 112, which interpolates between the positive and negative reference voltages Vref+ and Vref− applied thereto to generate the PWL approximation 204 of the integral non-linearity error of the main DAC 102. As shown in FIG. 2, a predetermined number of PWL breakpoint code values such as PWL breakpoints 206a–206d are determined, based at least in part on the overall shape of the actual integral non-linearity error curve 202. Each one of the PWL breakpoints 206a–206d is specified by a main DAC LSB code value Xn (n=0, 1, 2, 3, 4), and a corresponding integral non-linearity error value Ym (m=0, 1, 2, 3, 4, 5). The PWL approximation 204 allows linear interpolation between each adjacent pair of the PWL breakpoints 206a–206d to approximate the integral non-linearity error value Y for each main DAC LSB code value X.

In the preferred embodiment, the PWL breakpoint code values are selected so that they have a predetermined fixed relationship along the X axis. For example, the PWL breakpoint code values may be equally spaced relative to the X axis within the PWL approximation. As a result, it is sufficient to store only the Y axis values of the PWL breakpoints, such as the Y values Y1–Y5 for the PWL breakpoints 206a–206d, in the memory 106 to specify the selected PWL breakpoint code values. Moreover, because the PWL breakpoints have a fixed X axis relationship, the relationship between the PWL breakpoints and the Main DAC LSBs is known, and therefore the need for performing arithmetic operations to determine the relationship between the Main DAC Input and the PWL breakpoints is avoided.

It is noted that although each PWL curve is illustrated in FIG. 2 as a single continuous linear waveform, the waveforms may alternatively comprise any other suitable PWL curve. For example, each PWL curve may be a saw-tooth waveform or any other suitable waveform. It is further noted that the presently disclosed digital-to-analog converter 100 allows integral non-linearity calibration by an interpolation technique, storing only the predetermined number of PWL breakpoints in the memory 106 (see FIG. 1).

To maintain the continuity of the linear waveforms forming the PWL approximation 204 (see FIG. 2), the calibration DAC 112 is configured to produce analog outputs that either ramp up or ramp down between the positive and negative reference voltages Vref+ and Vref− applied thereto. To this end, the Main DAC LSBs at the input of the calibration DAC 112 are made to linearly increase (count up) or linearly decrease (count down) based on the relative values of the consecutive PWL breakpoints provided to the calibration DAC 112 by the calibration DACs 113–114. The state of the DAC control bit 110 controls whether the Main DAC LSBs are made to count up or count down. As a result, the calibration DAC 112 interpolates either (1) from the negative reference voltage Vref− to the positive reference voltage Vref+, or (2) from the positive reference voltage Vref+ to the negative reference voltage Vref−.

In the preferred embodiment, the calibration DAC 113 always provides the positive reference voltage Vref+, and the calibration DAC 114 always provides the negative reference voltage Vref−, to the calibration DAC 112. For example, the reference voltages provided by the calibration DACs 113–114 may range from about 10 mV to about 5 V, or from about −10 mV to about −5 V, or any other suitable voltage range. Further, there is no requirement that the positive reference voltage Vref+ be greater than the negative reference voltage Vref−. As successive segments of the PWL approximation 204 are generated, either the calibration DAC 113 or the calibration DAC 114 receives a new PWL breakpoint code value at its input to change the value of the reference voltage Vref+ or Vref− provided to the calibration DAC 112, and the Main DAC LSBs at the input of the calibration DAC 112 are made to reverse their counting direction.

Figure 3:
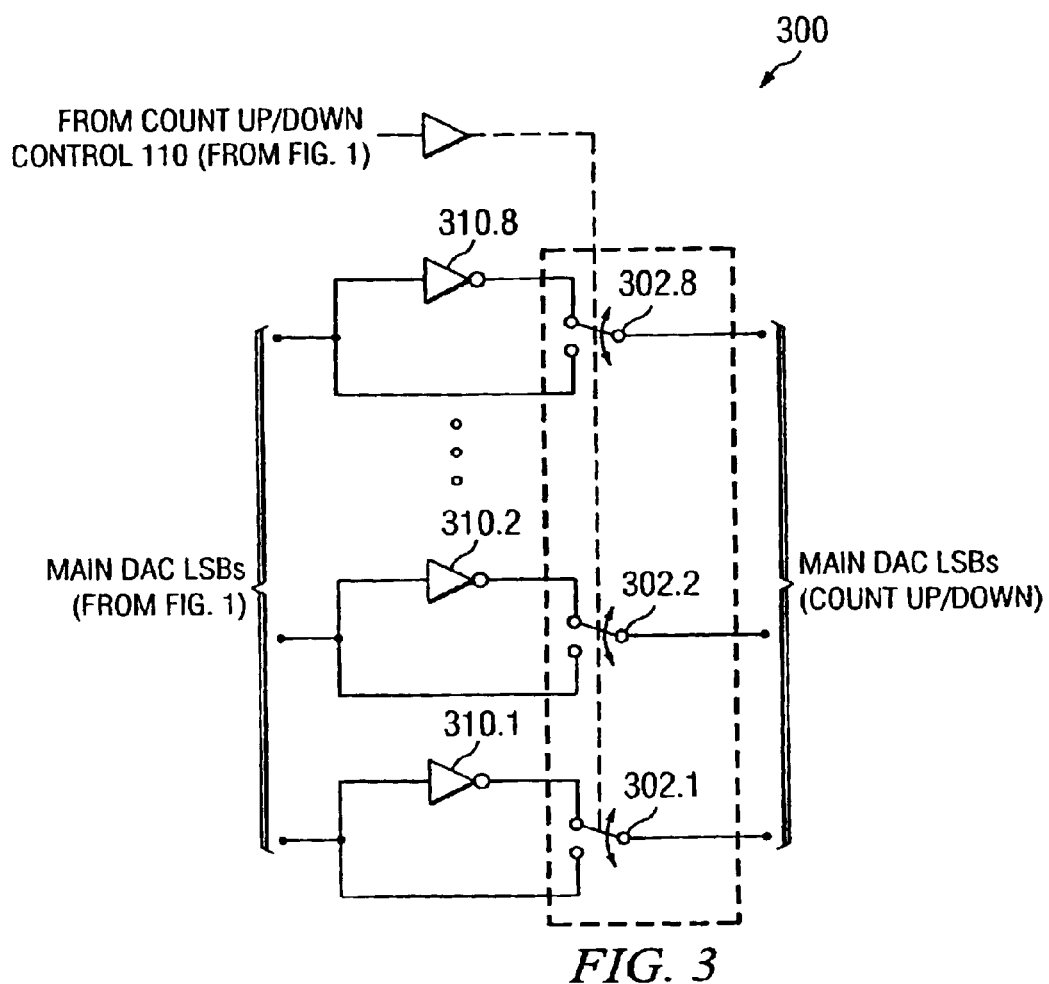
FIG. 3 is a schematic diagram of control circuitry for implementing an up/down counting capability within the DAC calibration circuit of FIG. 1.

FIG. 3 depicts an illustrative embodiment of up/down DAC control circuitry 300 included in the calibration DAC 112 (FIG. 1). In the illustrated embodiment, the DAC control circuitry 300 includes a plurality of inverters 310.1–310.8, and a corresponding plurality of switches 302.1–302.8, in which each switch 302.1–302.8 is controlled by the state of the Count up/down DAC control bit 110. For example, in the event the Count up/down control bit 110 is logical 0 (count up), the switches 302.1–302.8 may be actuated so that the Main DAC LSBs bypass the inverters 310.1–310.8; and, in the event the Count up/down control bit 110 is logical 1 (count down), the switches 302.1–302.8 may be actuated so that the Main DAC LSBs are provided to the inverters 310.1–310.8. In this way, the Main DAC LSBs at the input of the calibration DAC 112 may be allowed to linearly increase (count up), or may be made to linearly decrease (count down), before being applied to the remaining circuitry within the calibration DAC 112.

In the preferred embodiment, each one of the calibration DACs 112–114 has an R-2R type binary architecture. For example, the calibration DACs 113–114 may have 7–8 bits of resolution and accuracy or any other suitable resolution and accuracy, and therefore the calibration DACs 113–114 may be implemented as respective back-DAC R-2R structures. Further, for a PWL approximation having 256 segments, the calibration DAC 112 may be implemented as an 8-bit DAC, and the main DAC 102 may be implemented as a 16-bit DAC. Because the calibration DAC 112 is not required to be a high performance DAC, the calibration DAC 112 may comprise an untrimmed back-DAC R-2R structure, a segmented R-2R structure, or any other suitable DAC structure. In the event the calibration DAC 112 comprises an R-2R structure, only eight inverters (e.g., the inverters 310.1–310.8, see FIG. 3) are required to implement the up/down counting capability at the DAC input. It is noted that if the calibration DAC 112 employs thermometer coding or other type of coding, then the calibration DAC 112 may require additional digital logic circuitry to implement the up/down counting capability.

The DAC calibration technique disclosed herein will be better understood with reference to the following illustrative example. In this example, the main DAC 102 is a 16-bit monotonic DAC (N=16). Further, the PWL approximation 204 has 1024 linear segments (M=1024), i.e., $$M=2^K, K=10. \tag{1}$$

Further, the calibration DAC 112 is a 6-bit DAC (N-K=6) having positive and negative reference voltage inputs Vref+ and Vref−. In this example, the positive reference voltage Vref+ may be greater than or less than the negative reference voltage Vref−. In addition, each one of the calibration DACs 113–114 is a 10-bit DAC to assure sufficient resolution for accurately representing the maximum transfer function errors of the main DAC 102.

In this example, the transfer function error of the main DAC 102 is determined for every $64^{th}$ digital input code value of the DAC ($2^{N-K}=64$). These transfer function errors, which represent the PWL breakpoint code values (e.g., the PWL breakpoints 206a–206d, see FIG. 2) of the PWL approximation 204, are then stored in the memory 106.

Illustrative PWL breakpoint voltages (Vref−, Vref+), corresponding states of the Up/down Control bit, and corresponding code values at the input of the main DAC 102 (Main DAC 102 code values) and at the output of the up/down control circuit within the calibration DAC 112 (Cal DAC 112 code values), are indicated in the TABLE below.

TABLE

| Up/down Control bit | Main DAC 102 code values | Cal DAC 112 code values | Vref− (mV) | Vref+ (mV) | Inter-polation |
|---|---|---|---|---|---|
| 0 | 000 | 000 | 20 | 30 | 20 mV→30 mV |
| 0 | 001 | 001 | 20 | 30 | |
| 0 | 010 | 010 | 20 | 30 | |
| 0 | 011 | 011 | 20 | 30 | |
| 0 | 100 | 100 | 20 | 30 | |
| 0 | 101 | 101 | 20 | 30 | |
| 0 | 110 | 110 | 20 | 30 | |
| 0 | 111 | 111 | 20 | 30 | |
| 1 | 000 | 111 | 50 | 30 | 30 mV→50 mV |
| 1 | 001 | 110 | 50 | 30 | |
| 1 | 010 | 101 | 50 | 30 | |
| 1 | 011 | 100 | 50 | 30 | |
| 1 | 100 | 011 | 50 | 30 | |
| 1 | 101 | 010 | 50 | 30 | |
| 1 | 110 | 001 | 50 | 30 | |
| 1 | 111 | 000 | 50 | 30 | |
| 0 | 000 | 000 | 50 | 10 | 50 mV→10 mV |

As indicated in the above TABLE, the PWL breakpoint voltages include

PWL breakpoint voltage 1 (Vref−)=20 mV,
PWL breakpoint voltage 2 (Vref+)=30 mV,
PWL breakpoint voltage 3 (Vref−)=50 mV, and
PWL breakpoint voltage 4 (Vref+)=10 mV.

It is noted that the PWL breakpoint voltages 1–4 correspond to the Y axis values Y1, Y2, Y3, and Y5 of the PWL breakpoints 206a–206d, respectively, as depicted in FIG. 2. Accordingly, the calibration DAC 112 is operative to interpolate from the PWL breakpoint 206a to the PWL breakpoint 206b (20 mV→30 mV), from the PWL breakpoint 206b to the PWL breakpoint 206c (30 mV→50 mV), from the PWL breakpoint 206c to the PWL breakpoint 206d (50 mV→10 mV), and so on, to generate the PWL approximation 204.

The digital input code values (Main DAC Input) are provided to the main DAC 102, the 10 (K=10) most significant bits of the respective digital input code values (Main DAC MSBs) are provided to the address inputs of the memory 106, and the 6 (N-K=6) least significant bits of the respective digital input code values (Main DAC LSBs) are provided to the calibration DAC 112. The 10 Main DAC MSBs provided to the memory address inputs cause consecutive pairs of PWL breakpoint code values to be provided to the DAC registers 107–108. As described above, the PWL breakpoints are preferably selected to have a fixed relationship along the X axis, and therefore the relationship between the PWL breakpoints and the Main DAC LSBs is known and can be properly maintained. The DAC registers 107–108 then provide the consecutive PWL breakpoint code values to the calibration DACs 113–114, respectively, to generate the positive and negative reference voltages Vref+ and Vref− of the calibration DAC 112. In the event the calibration DAC 112 is required to interpolate from Vref− to Vref+, the code values at the input of the calibration DAC 112 count up. In the event the calibration DAC 112 is required to interpolate from Vref+ to Vref−, the code values at the input of the calibration DAC 112 count down.

For example, the above TABLE indicates that the PWL breakpoints 206a and 206b correspond to 20 mV (Vref−) and 30 mV (Vref+), respectively. Because the calibration DAC 112 is required to interpolate from 20 mV to 30 mV (i.e., from Vref− to Vref+), the calibration DAC 112 is controlled so that the input code values count up. The Count up/down control bit 110 is therefore reset to logical 0 (count up), and the switches 302.1–302.8 (see FIG. 3) are actuated so that the Main DAC LSBs bypass the inverters 310.1–310.8. As a result, a linearly increasing Main DAC LSB code sequence 000→111 is applied to the calibration DAC 112, thereby causing the calibration DAC 112 to count up within the interval 0 to X1, and to interpolate from Y2=20 mV to Y3=30 mV (see FIG. 2).

Next, the value of the negative reference voltage Vref− is changed from 20 mV to 50 mV, while the positive reference voltage Vref+ remains unchanged. It is noted that the PWL breakpoints 206b and 206c correspond to 50 mV (Vref−) and 30 mV (Vref+), respectively. Because the calibration DAC 112 is required to interpolate from 30 mV to 50 mV (i.e., from Vref+ to Vref−), the calibration DAC 112 is controlled to count down. The Count up/down control bit 110 is therefore set to logical 1 (count down), and the switches 302.1–302.8 are actuated so that the Main DAC LSBs pass through the inverters 310.1–310.8. As a result, the linearly increasing Main DAC LSB code sequence 000→111 is applied to the calibration DAC 112 and subsequently inverted by the inverters 310.1–310.8, thereby causing the calibration DAC 112 to count down (111→000) within the interval X1 to X2, and to interpolate from Y3=30 mV to Y5=50 mV (see FIG. 2).

Next, the value of the positive reference voltage Vref+ changes from 30 mV to 10 mV, while the value of the negative reference voltage Vref− remains unchanged. It is noted that the PWL breakpoints 206c and 206d correspond to 50 mV (Vref−) and 10 mV (Vref+), respectively. Because the calibration DAC 112 is required to interpolate from 50 mV to 10 mV (i.e., from Vref− to Vref+), the calibration DAC 112 is controlled to count up. The Count up/down control bit 110 is therefore reset to logical 0 (count up), and the switches 302.1–302.8 are actuated so that the Main DAC LSBs bypass the inverters 310.1–310.8. As a result, the linearly increasing Main DAC LSB code sequence 000→111 is applied to the calibration DAC 112, thereby causing the calibration DAC 112 to count up within the interval X2 to X3, and to interpolate from Y5=50 mV to Y1=10 mV (see FIG. 2). It is noted that within the next interval X3 to X4, the calibration DAC 112 is controlled to count down, as indicated in FIG. 2.

The DAC calibration technique continues in the manner described above until the entire PWL approximation 204 is obtained. Finally, the main DAC 102 and the calibration DAC 112 provide their respective analog outputs to the analog summing circuit 116 (see FIG. 1), which is operative to obtain the difference between the respective analog signals to produce the Calibrated Output.

Figure 4:
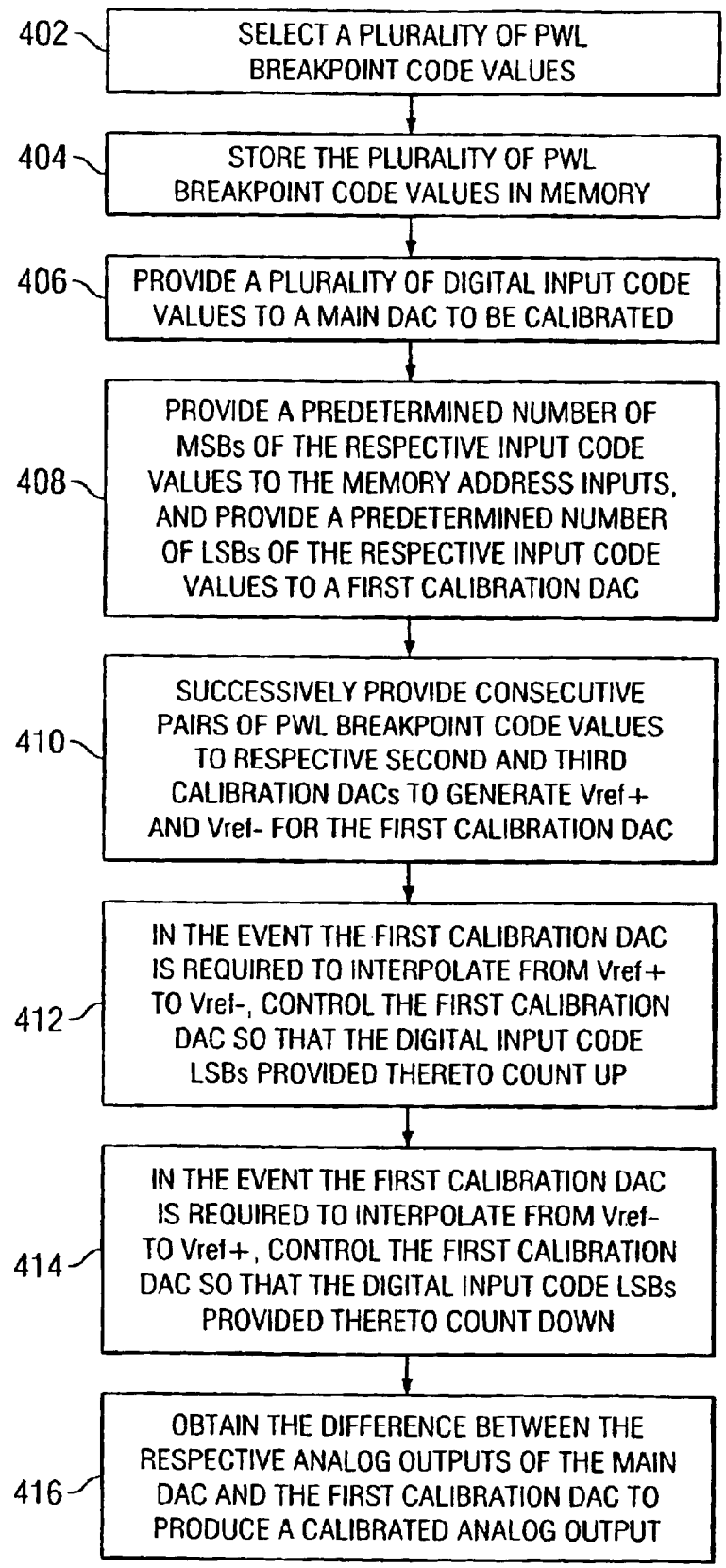
FIG. 4 is a flow diagram illustrating a method of operating the DAC calibration circuit of FIG. 1.

A method of operating the presently disclosed DAC calibration circuit is illustrated by reference to FIG. 4. As depicted in step 402, a plurality of PWL breakpoint code values are selected by determining a transfer function error of a main DAC to be calibrated. Next, the plurality of PWL breakpoint code values are stored, as depicted in step 404, in memory. A plurality of digital input code values are then provided, as depicted in step 406, to the main DAC. Further, a predetermined number of MSBs of the digital input code values are provided, as depicted in step 408, to the address inputs of the memory; and, a predetermined number of LSBs of the digital input code values are provided, as also depicted in step 408, to a first calibration DAC. Consecutive pairs of the PWL breakpoint code values are then successively provided, as depicted in step 410, to respective second and third calibration DACs by the memory, thereby generating corresponding positive and negative reference voltages Vref+ and Vref− for the first calibration DAC. In the event the first calibration DAC is required to interpolate from Vref− to Vref+, the first calibration DAC is controlled, as depicted in step 412, so that the digital input code LSBs provided thereto count up. In the event the first calibration DAC is required to interpolate from Vref+ to Vref−, the first calibration DAC is controlled, as depicted in step 414, so that the digital input code LSBs provided thereto count down. Finally, the difference between the respective analog outputs of the main DAC and the first calibration DAC is obtained, as depicted in step 416, to produce a calibrated analog output.

Having described the above illustrative embodiments, other alternative embodiments or variations may be made. For example, it should be understood that although the presently disclosed DAC calibration technique is described in the context of a DAC, essentially the same principles may also be applied to analog-to-digital converters (ADCs) that include internal DACs. Further, although the number of PWL breakpoints is a matter of design choice, those of ordinary skill in this art will appreciate that increasing the number of PWL breakpoints will generally increase the accuracy of the PWL approximation of the integral non-linearity error curve of the DAC to be calibrated. It is noted, however, that an increased number of PWL breakpoints will typically increase the memory storage requirements of the DAC.

In addition, as described above, the presently disclosed DAC calibration technique corrects for transfer function errors of the main DAC. Offset, full-scale, and integral linearity errors may therefore be corrected by this DAC calibration technique. In the presently disclosed embodiment, the first and last consecutive pairs of code values provided by the memory may be used to correct the offset error and the full-scale error, respectively.

In addition, in the preferred embodiment, the memory employed in the above-described DAC calibration technique is an internal, non-volatile memory. However, it is understood that a volatile memory may be alternatively employed in the event the user wishes to perform DAC calibration in a system. If a volatile internal memory is used, then the calibration coefficients may be downloaded into the memory using a standard digital interface, before performing regular DAC operation. To achieve a simpler implementation, the internal memory may be omitted and the inputs to the calibration DACs 113–114 may be externally provided to a chip incorporating the DAC 100 (see FIG. 1). Therefore, in this simplified embodiment of the presently disclosed DAC calibration technique, calibration coefficients may be measured and stored elsewhere in the system, and may then be provided externally to the chip from digital input ports/pins, thereby reducing the overall die area.

It will also be appreciated by those of ordinary skill in the art that modifications to and variations of the above-described all-analog calibration of string-DAC linearity may be made without departing from the inventive concepts disclosed herein. Accordingly, the invention should not be viewed as limited except as by the scope and spirit of the appended claims.

What is claimed is:

1. A calibrated digital-to-analog converter (DAC), comprising:
    a main DAC having a digital input and an analog output, the main DAC being configured, in the event a plurality of first digital code values are applied to its digital input, to produce corresponding analog output values at its analog output, wherein the analog output values produced by the main DAC deviate from desired analog output values of the main DAC;
    a memory having an address input and first and second data outputs, the memory being configured to store a plurality of second digital code values representing respective digital correction values, the memory being configured, in the event a predetermined number of high order bits of the first digital code values are applied to its address input, to provide selected consecutive correction values at its first and second data outputs, respectively;
    a first calibration DAC having a digital input, an analog output, a positive reference (Vref+) voltage input, and a negative reference (Vref−) voltage input, the first calibration DAC being configured, in the event Vref+ and Vref− voltage levels corresponding to the consecutive correction values provided at the first and second data outputs, respectively, of the memory are applied to its Vref+ and Vref− voltage inputs, and a sequence of low order bits of the first digital code values is applied to its digital input, to produce corresponding analog output values at its analog output; and
    an analog summing circuit configured to receive the analog outputs produced by the main DAC and the first calibration DAC, and to subtract the analog output of the first calibration DAC from the analog output of the main DAC to generate a calibrated analog output.

2. The calibrated DAC of claim 1 further including second and third calibration DACs having respective digital inputs and respective analog outputs, the second and third calibration DACs being configured, in the event the consecutive correction values provided at the first and second data outputs, respectively, of the memory are applied to their respective digital inputs, to produce corresponding analog output values at their respective analog outputs representing the Vref+ and Vref− voltage levels.

3. The calibrated DAC of claim 2 wherein the second calibration DAC is configured to provide the Vref+ voltage level to the Vref+ voltage input of the first calibration DAC, and wherein the third calibration DAC is configured to provide the Vref− voltage level to the Vref− voltage input of the first calibration DAC.

4. The calibrated DAC of claim 2 wherein each one of the first, second, and third calibration DACs has an R-2R type binary architecture.

5. The calibrated DAC of claim 1 wherein the first calibration DAC is further configured to interpolate between the Vref+ and Vref− voltage levels, thereby producing a piecewise linear approximation of an integral non-linearity error curve of the main DAC.

6. The calibrated DAC of claim 5 wherein the consecutive correction values correspond to consecutive piecewise linear breakpoint code values of the piecewise linear approximation.

7. The calibrated DAC of claim 6 wherein the piecewise linear breakpoint code values are substantially equally spaced within the piecewise linear approximation.

8. The calibrated DAC of claim 5 wherein the first calibration DAC is further configured to interpolate from the Vref− voltage level to the Vref+ voltage level, or from the Vref+ voltage level to the Vref− voltage level, based at least in part on the relative magnitudes of the consecutive correction values.

9. The calibrated DAC of claim 1 wherein the memory comprises a nonvolatile memory circuit.

10. The calibrated DAC of claim 9 wherein the memory circuit is selected from the group consisting of a fuse link memory, an EEPROM, and a FLASH memory.

11. The calibrated DAC of claim 1 wherein the main DAC has a resistor string architecture.

12. The calibrated DAC of claim 1 wherein the first calibration DAC has an R-2R type binary architecture.

13. The calibrated DAC of claim 1 wherein the selected consecutive correction values provided first by the memory at its respective data outputs are used to correct an offset error of the analog output.

14. The calibrated DAC of claim 1 wherein the selected consecutive correction values provided last by the memory at its respective data outputs are used to correct a full-scale error of the analog output.

15. The calibrated DAC of claim 1 wherein the memory comprises a volatile memory circuit.

16. The calibrated DAC of claim 15 wherein the memory is configured to receive the respective digital correction values downloaded via a digital interface.

17. The calibrated DAC of claim 1 wherein the main DAC, the memory, the first calibration DAC, and the analog summing circuit are implemented on an integrated circuit.

18. The calibrated DAC of claim 1 wherein the main DAC, the first calibration DAC, and the analog summing circuit are implemented on an integrated circuit, and the memory is implemented external to the integrated circuit.

19. A method of calibrating a digital-to-analog converter (DAC), comprising the steps of:

providing a main DAC having a digital input and an analog output;

in the event a plurality of first digital code values are applied to the digital input of the main DAC, producing corresponding analog output values at the analog output of the main DAC, wherein the analog output values produced by the main DAC deviate from desired analog output values of the main DAC;

storing a plurality of second digital code values representing respective digital correction values within a memory;

in the event a predetermined number of high order bits of the first digital code values are applied to an address input of the memory, providing selected consecutive correction values at first and second data outputs of the memory, respectively;

providing a first calibration DAC having a digital input, an analog output, a positive reference (Vref+) voltage input, and a negative reference (Vref−) voltage input;

in the event Vref+ and Vref− voltage levels corresponding to the consecutive correction values provided at the first and second data outputs, respectively, of the memory are applied to the Vref+ and Vref− voltage inputs of the first calibration DAC, and a sequence of low order bits of the first digital code values is applied to the digital input of the first calibration DAC, producing corresponding analog output values at the analog output of the first calibration DAC;

receiving the analog outputs produced by the main DAC and the first calibration DAC by an analog summing circuit; and subtracting the analog output of the first calibration DAC from the analog output of the main DAC by the analog summing circuit to generate a calibrated analog output.

20. The method of claim 19 further including the steps of providing second and third calibration DACs having respective digital inputs and respective analog outputs, and in the event the consecutive correction values provided at the first and second data outputs, respectively, of the memory are applied to the respective digital inputs of the second and third calibration DACs, producing corresponding analog output values at the respective analog outputs of the second and third calibration DACs, the corresponding analog output values representing the Vref+ and Vref− voltage levels.

21. The method of claim 20 further including the steps of providing the Vref+ voltage level to the Vref+ voltage input of the first calibration DAC by the second calibration DAC, and providing the Vref− voltage level to the Vref− voltage input of the first calibration DAC by the third calibration DAC.

22. The method of claim 19 wherein the selected consecutive correction values provided first in the second providing step are used to correct an offset error of the analog output.

23. The method of claim 19 wherein the selected consecutive correction values provided last in the second providing step are used to correct a full-scale error of the analog output.

24. The method of claim 19 further including the step of downloading the respective digital correction values to the memory.

25. The method of claim 24 wherein the memory comprises a volatile memory circuit.

26. The method of claim 19 wherein the main DAC, the memory, the first calibration DAC, and the analog summing circuit are implemented on an integrated circuit.

27. The method of claim 19 wherein the main DAC, the first calibration DAC, and the analog summing circuit are implemented on an integrated circuit, and the memory is implemented external to the integrated circuit.

* * * * *